US 10,636,840 B2

(12) United States Patent
Manipatruni et al.

(10) Patent No.: US 10,636,840 B2
(45) Date of Patent: Apr. 28, 2020

(54) QUATERNARY SPIN HALL MEMORY

(71) Applicant: Intel Corporation, Santa Clara, CA (US)

(72) Inventors: Sasikanth Manipatruni, Hillsboro, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/347,792

(22) PCT Filed: Dec. 5, 2016

(86) PCT No.: PCT/US2016/065023
§ 371 (c)(1),
(2) Date: May 6, 2019

(87) PCT Pub. No.: WO2018/106212
PCT Pub. Date: Jun. 14, 2018

(65) Prior Publication Data
US 2019/0312086 A1      Oct. 10, 2019

(51) Int. Cl.
*H01L 27/22*        (2006.01)
*G11C 11/16*        (2006.01)
(Continued)

(52) U.S. Cl.
CPC .......... *H01L 27/222* (2013.01); *G11C 11/161* (2013.01); *H01F 10/329* (2013.01);
(Continued)

(58) Field of Classification Search
None
See application file for complete search history.

(56) References Cited

U.S. PATENT DOCUMENTS

| 7,502,248 B2 * | 3/2009 | Lim | .............. B82Y 25/00 |
| | | | 365/158 |
| 2012/0039119 A1 * | 2/2012 | Apalkov | .............. B82Y 25/00 |
| | | | 365/171 |

(Continued)

FOREIGN PATENT DOCUMENTS

| WO | 2010101586 | 9/2010 |
| WO | 2016190879 | 12/2016 |

OTHER PUBLICATIONS

Gambardella, P., "Introduction to Spin Torques and Spin-Orbit Torques in Metal Layers", Department of Materials, ETH Zurich, Switzerland Jun. 22, 2015. (Year: 2015).*

(Continued)

*Primary Examiner* — J. E. Schoenholtz
(74) *Attorney, Agent, or Firm* — Green, Howard, & Mughal LLP

(57) ABSTRACT

An apparatus is provided which comprises: a first magnetic junction having a fixed magnetic layer and a 4-state free magnetic layer; a second magnetic junction having a fixed magnetic layer and a 4-state free magnetic layer; and a first layer of spin orbit coupling material adjacent to the first magnetic junction and the second magnetic junction via their respective 4-state free magnetic layers. Described is an apparatus which comprises a 4-state free magnetic layer; a layer of SOC material adjacent to the 4-state free magnetic layer; a first interconnect coupled to the layer of SOC material.

23 Claims, 7 Drawing Sheets

(51) Int. Cl.
  *H01F 10/32* (2006.01)
  *H01L 43/10* (2006.01)
  *H01L 43/08* (2006.01)

(52) U.S. Cl.
  CPC ..... *H01F 10/3254* (2013.01); *H01F 10/3268* (2013.01); *H01L 43/08* (2013.01); *H01L 43/10* (2013.01)

(56) References Cited

U.S. PATENT DOCUMENTS

| | | | |
|---|---|---|---|
| 2013/0121067 A1 | 5/2013 | Kent et al. | |
| 2013/0224521 A1* | 8/2013 | Wang | G11B 5/66 428/828 |
| 2013/0258764 A1* | 10/2013 | Ranjan | G11C 11/16 365/158 |
| 2014/0070344 A1* | 3/2014 | Khalili Amiri | H01L 43/08 257/421 |
| 2014/0219012 A1* | 8/2014 | Manipatruni | H03K 19/16 365/158 |
| 2015/0041934 A1 | 2/2015 | Khvalkovskiy et al. | |
| 2015/0200003 A1* | 7/2015 | Buhrman | G11C 11/18 365/158 |
| 2015/0213869 A1* | 7/2015 | Wu | G11C 11/1693 365/154 |
| 2016/0300612 A1 | 10/2016 | Manipatruni et al. | |
| 2017/0178705 A1* | 6/2017 | Buhrman | H01L 43/08 |
| 2017/0200499 A1* | 7/2017 | Rakshit | G11C 14/0081 |
| 2018/0145691 A1 | 5/2018 | Manipatruni et al. | |
| 2018/0166500 A1* | 6/2018 | Wang | H03K 19/177 |
| 2019/0067561 A1* | 2/2019 | Avci | G11C 11/161 |

OTHER PUBLICATIONS

Wang, Y., et al. "High TMR Ratio in Perpendicular MTJs Using Fe-Based Heusler Alloy Fe2Cr1—XCoxSi." 2015 IEEE Magnetics Conference (INTERMAG), 2015, doi:10.1109/intmag.2015.7157503. (Year: 2015).*

Cubukcu, Murat, et al. "Spin-Orbit Torque Magnetization Switching of a Three-Terminal Perpendicular Magnetic Tunnel Junction." Applied Physics Letters, vol. 104, No. 4, 2014, p. 042406., doi:10.1063/1.4863407. (Year: 2014).*

Eken, E., "Developing Variation Aware Simulation Tools, Models and Designs for STT-RAM" Thesis in Departement of Electrical Engineering, University of Pittsburgh, 2017. (Year: 2017).*

Vatankhahghadim, Aynaz, and Ali Sheikholeslami. "A Multi-Level Cell for STT-MRAM with Biaxial Magnetic Tunnel Junction." 2015 IEEE International Symposium on Multiple-Valued Logic, 2015, doi:10.1109/ismvl.2015.38 (Year: 2015).*

M.V. Pitke, "Biaxial anisotropy for memory applications," Czechoslovak Journal of Physics B, vol. 21, No. 4-5, pp. 467-469, 1971. (Year: 1971).*

International Search Report & Written Opinion dated Aug. 23, 2017 for PCT Patent Application No. PCT/US16/65023.

International Preliminary Report on Patentability from PCT/US2016/065023 dated Jun. 20, 2019 10 pgs.

* cited by examiner

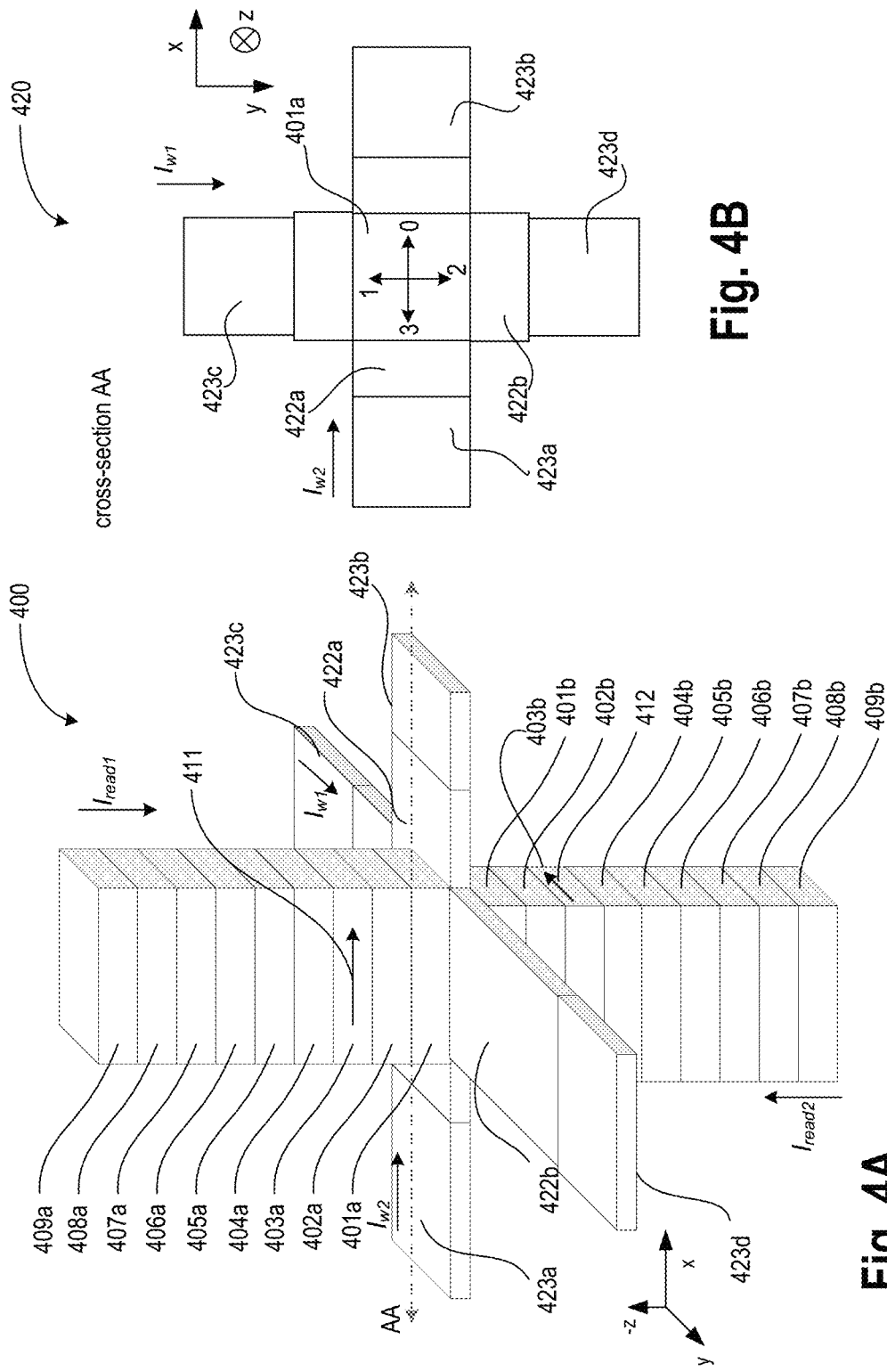

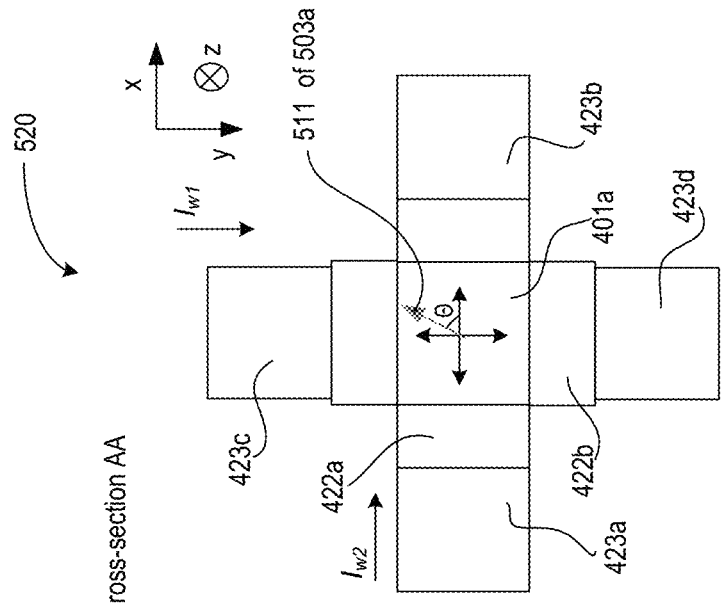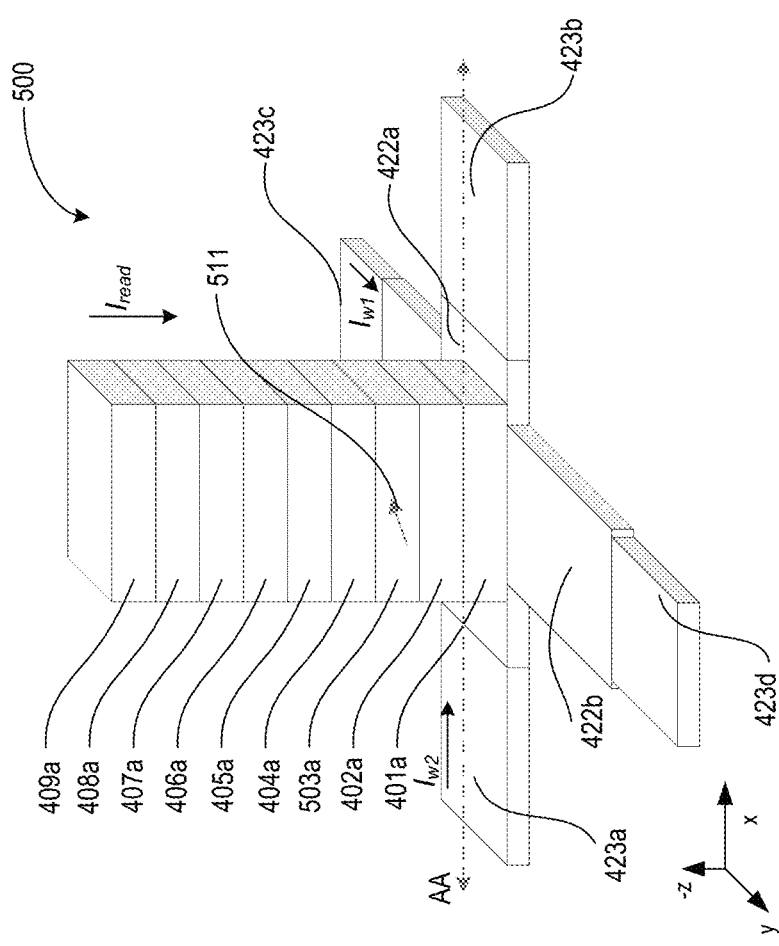
Fig. 5B
Fig. 5A

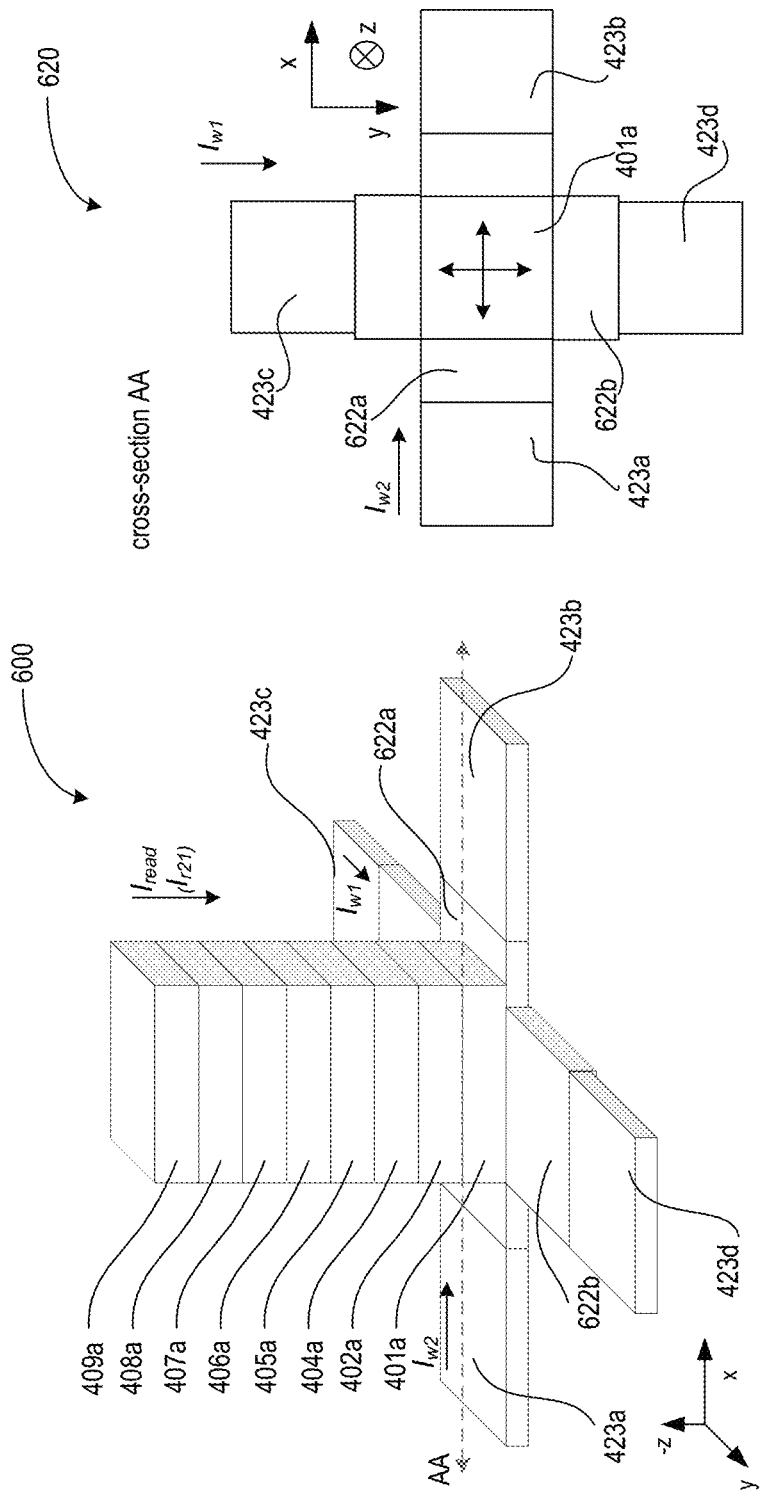

QUATERNARY SPIN HALL MEMORY

CLAIM OF PRIORITY

This Application is a National Stage Entry of, and claims priority to, PCT Application No. PCT/US2016/065023, filed on Dec. 5, 2016 and titled "QUATERNARY SPIN HALL MEMORY," which is incorporated by reference in its entirety for all purposes.

BACKGROUND

Embedded memory with state retention can enable energy and computational efficiency. However, leading spintronic memory options, for example, spin transfer torque based magnetic random access memory (STT-MRAM), suffer from the problem of high voltage and high write current during the programming (e.g., writing) of a bit-cell. For instance, large write current (e.g., greater than 100 micro-Ampere (μA)) and voltage (e.g., greater than 0.7 Volts (V)) are required to write a tunnel junction based magnetic tunnel junction (MTJ). Limited write current also leads to high write error rates or slow switching times (e.g., exceeding 20 nano-seconds (ns)) in MTJ based MRAM. The presence of a tunneling path leads to reliability issues in magnetic tunnel junctions.

Further, majority of the electronic computation today is carried out in Boolean logic in digital computers and electronics. Boolean logic is a form of algebra in which all values are reduced to either TRUE (I) or FALSE (0). Boolean logic gates have scaled following the Moore's law as transistor gate lengths have scaled (e.g., to 20 nanometer (nm)). Some limitations to Boolean logic are: limited density of logic gates limited by algebraic constrains in two-level logic (Galois field-2 algebra); limited density of interconnect bandwidth limited by the number representation in base-2 number system; and limited density of memory states limited by the information content per bit.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates a three dimensional (3D) view quaternary spin Hall device comprising 4-state magnets, in accordance with some embodiments of the disclosure.

FIG. 4B illustrates a top view of the quaternary spin Hall device of FIG. 4A showing write paths for +x, −x, +y, and −y directions, according to some embodiments of the disclosure.

FIG. 5A illustrates a 3D view of a 4-state spin Hall memory with a single recording layer and single fixed layer, in accordance with some embodiments of the disclosure.

FIG. 5B illustrates a top view of the 4-state spin Hall memory of FIG. 5A, in accordance with some embodiments of the disclosure.

FIG. 6A illustrates a 3D view of a 4-state spin Hall memory with a single recording layer and single fixed layer, and with an inverse SOC based readout, in accordance with some embodiments of the disclosure.

FIG. 6B illustrates a top view of the 4-state spin Hall memory of FIG. 6A, in accordance with some embodiments of the disclosure.

DETAILED DESCRIPTION

Figure 1:
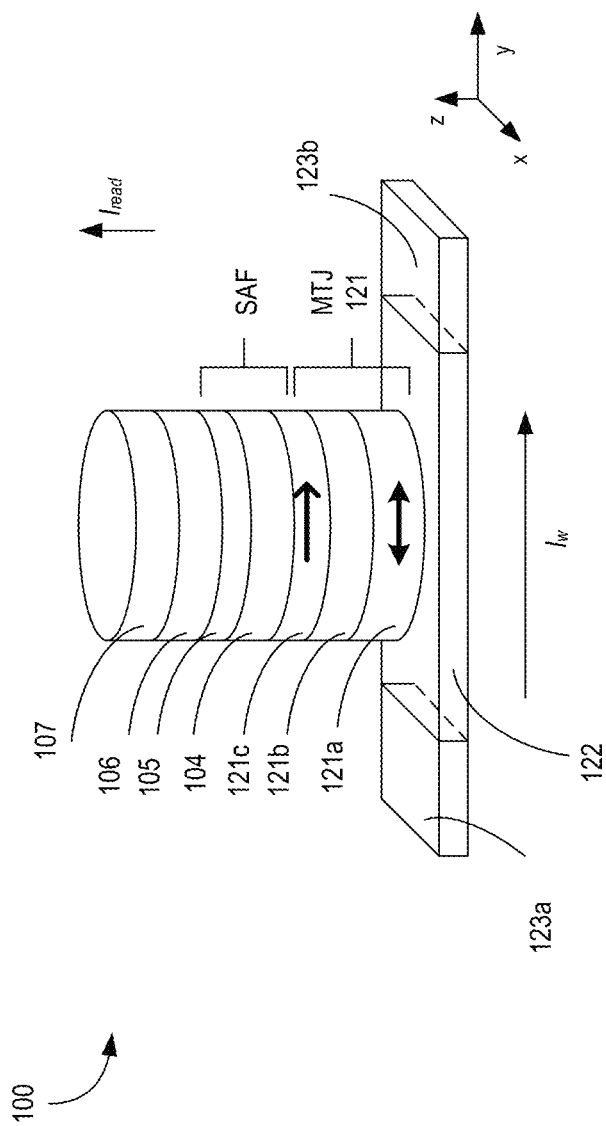
FIG. 1 illustrates a device having an in-plane magnetic tunnel junction (MTJ) stack coupled to a spin orbit coupling (SOC) interconnect.

Various embodiments describe a quaternary spin Hall effect memory that can be used for non-volatile logic and memory. In some embodiments, a first magnetic junction (e.g., a spin valve or a magnetic tunneling junction (MTJ)) is provided having a fixed magnetic layer and a 4-state free magnetic layer. Here, the term "free magnet layer" generally refers to a magnet whose magnetization is not predetermined or pinned (or fixed), but can vary according to external stimulus (e.g., spin torque). Here, the term "fixed magnet layer" generally refers to a magnet whose magnetization is predetermined or pinned (or fixed), and cannot vary according to external stimulus (e.g., spin torque). In some embodiments, a second magnetic junction is provided having a fixed magnetic layer and a 4-state free magnetic layer such that the first magnetic junction is coupled to the second magnetic junction via a layer of spin orbit coupling material.

In some embodiments, instead of dual magnetic junctions coupled to a layer of spin orbit coupling (SOC) material, a single magnetic junction is provided which comprises a 4-state free magnetic layer; a layer of spin orbit coupling material adjacent to the 4-state free magnetic layer; a first interconnect coupled to the layer of spin orbit coupling material; and a second interconnect orthogonal to the first interconnect, wherein the second interconnect is coupled to the layer of SOC material. In some embodiments, the fixed magnetic layer has a magnetization at an angle between 0 degrees and 90 degrees (but not 45 degrees), wherein the fixed magnetic layer is coupled to the 4-state free magnetic layer via a metal layer or a dielectric layer. In some embodiments, the fixed magnetic layer is removed altogether.

The apparatus of various embodiments enable encoding of a four magnetic states (4-state) in a spin Hall memory. As such, memory capacity increases compared to traditional memories. The apparatus of various embodiments allow for low programming voltages which is enabled by giant spin orbit effects. The apparatus of various embodiments allow lower write error rates to enable faster magnetic random access memories. For example, very low error rates while having an access time of less than 10 ns can be realized in various embodiments. In some embodiments, the quaternary memory provides for decoupled write and read paths to enable faster read latencies. In some embodiments, significant smaller read currents through a magnetic junction are used which allow for improved reliability of magnetic junctions. For example, less than ten micro Amperes (μA) of read current is used by the quaternary memory of various embodiments compared to 100 μA for nominal write by Spin Transfer Torque (STT) magnetic tunneling junction (MTJ). The 4-state memory of the various embodiments allow for multiple parallel read operations to increase read performance. Other technical effects will be evident from the various embodiments and figures.

In the following description, numerous details are discussed to provide a more thorough explanation of the embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom." "over," "under," and the like in the description and in the claims, if any, are used for descriptive purposes and not necessarily for describing permanent relative positions.

FIG. 1 illustrates device 100 having an in-plane magnetic tunnel junction (MTJ) stack coupled to a spin orbit coupling (SOC) interconnect. Here, the stack of layers having MTJ 121 is coupled to an electrode 122 formed of Spin Hall Effect (SHE) or SOC material, where the SHE material converts charge current $I_W$ (or write current) to spin current $I_S$. Device 100 forms a three terminal memory cell with SHE induced write mechanism and MTJ based read-out. Device 100 comprises magnetic junction 121, SHE Interconnect or electrode 122, and non-magnetic metal(s) 123a/b. In one example, magnetic junction 121 comprises layers 121a, 121b, and 121c. In some embodiments, layers 121a and 121c are ferromagnetic (FM) layers. In some embodiments, layer 121b is a metal or a tunneling dielectric. When layer 121b is a metal, magnetic junction 121 is a spin valve, and when layer 121b is a tunneling dielectric then magnetic junction 121 is a MTJ. One or both ends along the horizontal direction of SHE Interconnect 122 is formed of non-magnetic metals 123a/b. Additional layers 104, 105, 106, and 107 can also be stacked on top of layer 121c. In some embodiments, layer 107 is non-magnetic metal electrode (e.g., Cu electrode).

A wide combination of materials can be used for material stacking of MTJ 121. For example, the stack of layers 121a, 121b, 121c, 104, 105, and 106 are formed of materials which include: $Co_xFe_yBz$, MgO, $Co_xFe_yBz$, Ru, $Co_xFe_yBz$, IrMn, Ru, Ta, and Ru, respectively, where 'x,' 'y,' and 'z' are fractions of elements in the alloys. Other materials may also be used to form MTJ 121. In some embodiments, MTJ 121 stack comprises free 4-state magnetic layer 121a, MgO tunneling oxide 121b, a fixed magnetic layer 121c which is a combination of CoFe, Ru, and CoFe layers, respectively, a Synthetic Anti-Ferromagnet (SAF) comprising layers 104 and 105, and an Anti-Ferromagnet (AFM) layer 106. The SAF layer has the property, that the magnetizations in the two CoFe layers are opposite, and allows for cancelling the dipole fields around the free magnetic layer such that a stray dipole field will not control the free magnetic layer.

In some embodiments, the free and fixed magnetic layers (121a and 121c, respectively) are formed of CFGG (i.e., Cobalt (Co), Iron (Fe), Germanium (Ge), or Gallium (Ga) or a combination of them). In some embodiments, FM 121a/c are formed from Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions.

SHE Interconnect 122 (or the write electrode) is made of one or more of β-Tantalum (β-Ta), Ta, (β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. SHE Interconnect 122 transitions into high conductivity non-magnetic metal(s) 123a/b to reduce the resistance of SHE Interconnect 122. The non-magnetic metal(s) 123a/b are formed from one or more of: Cu, Co, α-Ta, Al, CuSi, or NiSi.

In one case, the magnetization direction of the fixed magnetic layer 121c is in-plane relative to the magnetization direction of the free magnetic layer 121a (e.g., magnetization directions of the free and fixed magnetic layers are parallel). The thickness of a ferromagnetic layer (i.e., fixed or free magnetic layer) may determine its equilibrium magnetization direction. For example, when the thickness of the ferromagnetic layer 121a/121c is above a certain threshold (depending on the material of the magnet, e.g. approximately 1.5 nm for CoFe), then the ferromagnetic layer exhibits magnetization direction which is in-plane.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC (face centered cubic lattice), BCC (body centered cubic lattice), or $L1_0$-type of crystals, where $L1_0$ is a type of crystal class which exhibits perpendicular magnetizations), can also determine the direction of magnetization.

In this example, the applied current $I_w$ is converted into spin current $I_s$ by SHE Interconnect 122. This spin current switches the direction of magnetization of the free layer and thus changes the resistance of MTJ 121. However, to read out the state of MTJ 121, a sensing mechanism is used to sense the resistance change.

The magnetic cell is written by applying a charge current via SHE Interconnect 122. The direction of the magnetic writing (in the free magnet layer 121*a*) is decided by the direction of the applied charge current. Positive currents (e.g., currents flowing in the +y direction) produce a spin injection current with transport direction (along the +z direction) and spins pointing to the +x direction. The injected spin current in-turn produces spin torque to align the free magnet 121*a* (coupled to the SHE layer 122 of SHE material) in the +x direction. Negative currents (e.g., currents flowing in the −y direction) produce a spin injection current with transport direction (along the +z direction) and spins pointing to the −x direction. The injected spin current in-turn produces spin torque to align free magnet 121*a* (coupled to the SHE material of layer 122) in the −x direction. In some embodiments, in materials with the opposite sign of the SHE/SOC effect, the directions of spin polarization and thus of the free layer magnetization alignment are reversed compared to the above.

Figure 2:
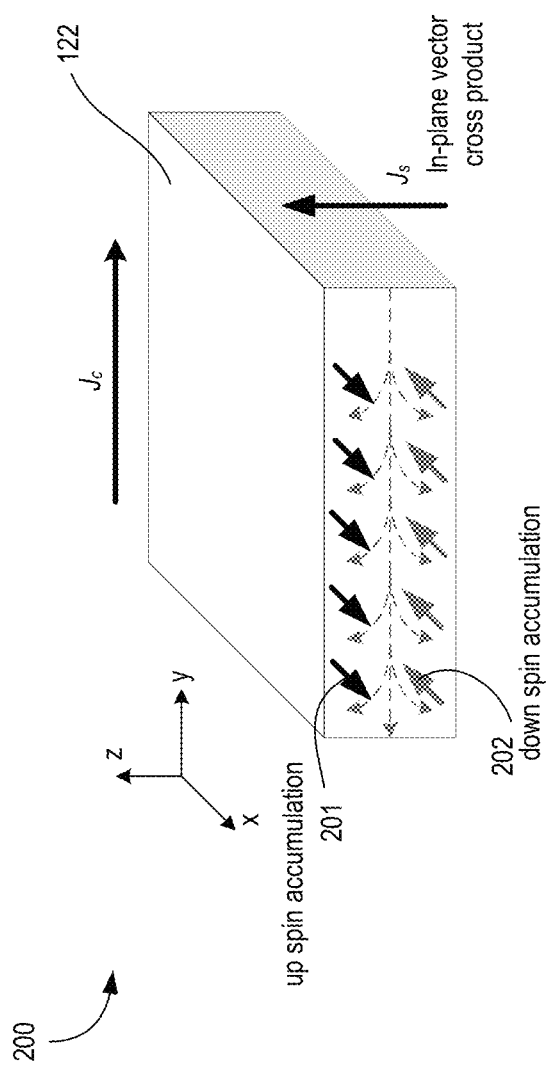
FIG. 2 illustrates a cross-sectional view of the SOC interconnect with in-plane up and down spins generated from a flow of charge current.

FIG. 2 illustrates cross-sectional view 200 of the SOC interconnect 122 with in-plane up and down spins generated from a flow of charge current. It is pointed out that those elements of FIG. 2 having the same reference numbers (or names) as the elements of any other figure can operate or function in any manner similar to that described, but are not limited to such. In this example, positive charge current represented by $J_c$ produces spin-top (e.g., in the +x direction) polarized current 201 and spin-bottom (e.g., in the −x direction) polarized current 202. The injected spin current $\vec{I}_s$ generated by a charge current $\vec{I}_c$ in the write electrode is given by:

$$\vec{I}_s = P_{SHE}(w, t, \lambda_{sf}, \theta_{SHE})(\hat{z} \times \vec{I}_c) \quad (1)$$

where, the vector of spin current $\vec{I}_s = \vec{I}_\uparrow - \vec{I}_\downarrow$ is the difference of currents with spin along and opposite to the spin polarization direction, $\hat{z}$ the unit vector perpendicular to the interface, $P_{SHE}$ is the spin Hall injection efficiency which is the ratio of magnitude of transverse spin current to lateral charge current, w is the width of the magnet, t is the thickness of the SHE Interconnect 122, $\lambda_{sf}$ is the spin flip length in SHE Interconnect 122, $\theta_{SHE}$ is the spin Hall angle for SHE Interconnect 122 to free ferromagnetic layer interface. The injected spin angular momentum responsible for the spin torque given by:

$$\vec{S} = \hbar \vec{I}_s / 2e \quad (2)$$

The generated spin up and down currents 201/202 (e.g., $\vec{J}_s$) are described as a vector cross-product given by:

$$\vec{J}_s = \theta_{SHE}(\hat{\sigma} \times \vec{J}_c)$$

where $\hat{\sigma}$ is the unit vector of magnetic moment.

Figure 3:
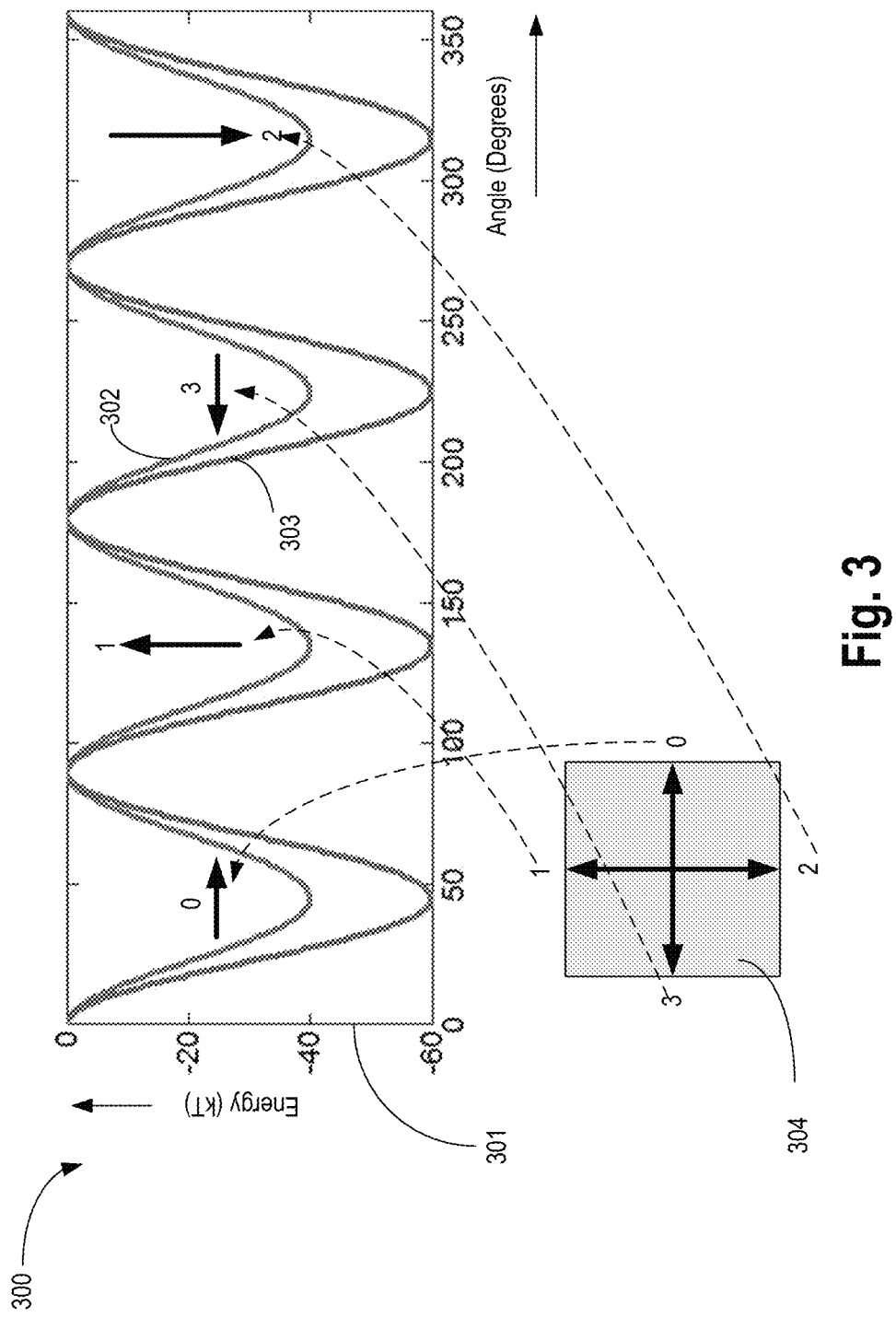
FIG. 3 illustrates a plot showing magnetic crystalline energy of a four state or quaternary state (4-state) magnet and corresponding 4-state magnet used for forming a 4-state read sensor, in accordance with some embodiments of the disclosure.

FIG. 3 illustrates plot 300 showing magnetic crystalline energy of a four state or quaternary state (4-state) magnet (e.g., magnetic 121*a*) and corresponding 4-state magnet used for forming a 4-state read sensor, in accordance with some embodiments of the disclosure. It is pointed out that those elements of FIG. 3 having the same reference numbers (or names) as the elements of any other figure can operate or function in any manner similar to that described, but are not limited to such.

Here, the x-axis is angle in degrees, and the y-axis is Energy in kT (where 'k' is Boltzmann constant and 'T' is temperature). Plot 301 illustrates two waveforms—302 and 303. Waveform 302 illustrates the thermal energy separation or barrier between four magnetic orientations of 4-state magnet 304. In some embodiments, 4-state magnet 304 is formed of a material such that the four magnetic orientations are separated by 40 kT of thermal energy barrier as illustrated by waveform 302. Waveform 303 is similar to waveform 302 except the thermal energy separation between the four magnetic orientations is 60 kT. In some embodiments, the 4-state magnetic recording media has four uniquely defined memory states. In some embodiments, the 4-state magnetic recording media is accessed by a 4-state magnetic read head with four uniquely measureable tunnel magnetoresistance (TMR) TMR or Giant magnetoresistance (GMR) outputs.

In some embodiments, the four orientations are defined for the 4-state logic memory element such that orientations '0' and '1' are separated by 90 degrees, orientations '1' and '3' are separated by 90 degrees, orientations '3' and '2' are separated by 90 degrees, orientations '0' and '3' are separated by 180 degrees, and orientations '1' and '2' are separated by 180 degrees. In some embodiments, with reference to a four quadrant 2D vector space, magnetic orientation facing +x direction (e.g., East) is orientation '0'; magnetic orientation facing +y direction (e.g., North) is orientation '1', magnetic orientation facing −x direction (e.g., West) is orientation '3', and magnetic orientation facing −y direction (e.g., South) is orientation '2'.

In some embodiments, 4-state magnet 304 is formed using cubic magnetic crystalline anisotropy magnets. In some embodiments, 4-state magnet 304 is formed by combining shape and exchange coupling to create two equal easy axes for nanomagnets. In some embodiments, the 4-state magnet comprises a material of bi-axial anisotropy. In some embodiments, 4-state magnet 304 comprises of a material selected from a group consisting of: Fe, Ni, Co and their alloys, magnetic insulators, and Heusler alloys of the form $X_2YZ$. In some embodiments, the magnetic insulators comprises of a material selected from a group consisting of: magnetite $Fe_3O_4$ and $Y_3Al_5O_{12}$. In some embodiments, the Heusler alloys comprises of one of: $Co_2FeSi$ and $Mn_2Ga$.

In some embodiments, 4-state magnet 304 is formed with high spin polarization materials. Heusler alloys are an example of high spin polarization materials. Heusler alloys are ferromagnetic metal alloys based on Heusler phase. Heusler phases are intermetallics with particular composition and face-centered cubic (FCC) crystal structure. Heusler alloys are ferromagnetic because of double-exchange mechanism between neighboring magnetic ions. The neighboring magnetic ions are usually manganese ions, which sit at the body centers of the cubic structure and carry most of the magnetic moment of the alloy.

In some embodiments, Heusler alloys such as $Co_2FeAl$ and $Co_2FeGeGa$ are used for forming 4-state magnet 304/121*a*. Other examples of Heusler alloys include: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2VAl$, $Mn_2VGa$, $Co_2FeGe$, etc.

In some embodiments, 4-state magnet 304 is formed with a sufficiently high anisotropy ($H_k$) and sufficiently low magnetic saturation ($M_s$) to increase injection of spin currents. For example, Heusler alloys of high $H_k$ and low $M_s$ are used to form 4-state magnet 304.

Magnetic saturation $M_s$ is generally the state reached when an increase in applied external magnetic field H cannot increase the magnetization of the material (i.e., total magnetic flux density B substantially levels off). Here, sufficiently low $M_s$ refers to $M_s$ less than 200 kA/m (kilo-Amperes per meter). Anisotropy $H_k$ generally refers to the material property which is directionally dependent. Materials with $H_k$ are materials with material properties that are highly directionally dependent. Here, sufficiently high $H_k$ in context of Heusler alloys is considered to be greater than 2000 Oe (Oersted). For example, a half metal that does not have bandgap in spin up states but does have bandgap in spin down states (e.g., at the energies within the bandgap, the material has 100% spin up electrons). If the Fermi level of the material is in the bandgap, injected electrons will be close to 100% spin polarized. In this context, "spin up" generally refers to the positive direction of magnetization, and "spin down" generally refers to the negative direction of magnetization. Variations of the magnetization direction (e.g. due to thermal fluctuations) result in mixing of spin polarizations.

FIG. 4A illustrates a three dimensional (3D) view quaternary spin Hall device 400 comprising 4-state magnets, in accordance with some embodiments of the disclosure. It is pointed out that those elements of FIG. 4A having the same reference numbers (or names) as the elements of any other figure can operate or function in any manner similar to that described, but are not limited to such.

In some embodiments, quaternary spin Hall device 400 comprises a dual magnetic junction (e.g., first and second magnetic junctions), wherein the first and second magnetic junctions are coupled to each other via a SOC material. In some embodiments, quaternary spin Hall device 400 comprises a first magnetic junction (e.g., layers 401a, 402a, 403a, 404a, 405a, 406a, 407a, 408a, and 409a); a second magnetic junction (e.g., layers 401b, 402b, 403b, 404b, 405b, 406b, 407b, 408b, and 409b); and a layer of spin orbit coupling material 422a/b, wherein the first magnetic junction is coupled to the second magnetic junction via the layer of spin orbit coupling material 422a/b.

In some embodiments, the first magnetic junction comprises free 4-state (or quaternary) magnetic layer 401a. In some embodiments, free 4-state (or quaternary) magnetic layer 401a includes zero state, first state, second state, and third state, wherein the zero state is to point in a +x-direction, wherein the first state is to point in a +y-direction, wherein the second state is to point in a -y-direction, and wherein the third state is to point in a -x-direction. In some embodiments, the thermal barrier between the zero, first, second, and third, is greater than or equal to 10 kT. In some embodiments, 4-state free magnetic layer 401a comprises a material selected from a group consisting of: Fe, Ni, Co and their alloys, magnetic insulators, and Heusler alloys of the form $X_2YZ$. In some embodiments, the magnetic insulators comprises a material selected from a group consisting of: magnetite $Fe_3O_4$ and $Y_3Al_5O_{12}$. In some embodiments, 4-state free magnetic layer 401a comprises a material of bi-axial anisotropy.

In some embodiments, the first magnetic junction comprises a fixed magnetic layer 403a which is coupled to 4-state free magnetic layer 401a via a non-magnetic metal layer or dielectric layer 402a. In some embodiments, dielectric layer 402a comprises MgO. In some embodiments, fixed magnetic layer 403a has a magnetization 411 which is in-plane and along +x or -x axes. In some embodiments, when non-magnetic metal layer 402a is sandwiched between 4-state free magnetic layer 401a and fixed magnetic layer 403a, then first magnetic junction is a spin valve. In some embodiments, when dielectric layer 402a is sandwiched between 4-state free magnetic layer 401a and fixed magnetic layer 403a, then first magnetic junction is a magnetic tunneling junction.

In some embodiments, fixed magnetic layer 403a is formed of CFGG (i.e., Cobalt (Co), Iron (Fe), Germanium (Ge), or Gallium (Ga) or a combination of them). In some embodiments, fixed magnet layer 403a comprises one or a combination of materials selected from a group consisting of a Heusler alloy, Co, Fe, Ni, Gd, B, Ge, Ga, permalloy, and Yttrium Iron Garnet (YIG). Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy is a material selected from a group consisting of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, and MnGaRu.

In some embodiments, layer 404a is adjacent to fixed magnetic layer 403a. In some embodiments, layer 404a comprises Ru. In some embodiments, layer 405a is adjacent to layer 404a. In some embodiment, layer 405a comprises Co and Fe (e.g., CoFe). In some embodiments, layer 406a is adjacent to layer 405a. In some embodiments, layer 406a comprises Ir and Mn (e.g., IrMn). In some embodiments, layer 407a is adjacent to layer 406a. In some embodiments, layer 407a comprises Ru. In some embodiments, layer 408a is adjacent to layer 407a. In some embodiments, layer 408a comprises Ta. In some embodiments, layer 409a is adjacent to layer 408a. In some embodiments, layer 409a comprises Ru. In some embodiments, an electrode (not shown and similar to layer 107) is adjacent to layer 409a.

In some embodiments, the second magnetic junction comprises free 4-state (or quaternary) magnetic layer 401b. In some embodiments, free 4-state (or quaternary) magnetic layer 401b is formed of the same material as free 4-state (or quaternary) magnetic layer 401a. In some embodiments, second magnetic junction comprises a fixed magnetic layer 403b which is coupled to 4-state free magnetic layer 401b via a non-magnetic metal layer or dielectric layer 402b. In some embodiments, dielectric layer 402b comprises MgO. In some embodiments, fixed magnetic layer 403b has a magnetization 412 which is in-plane and along +y or -y axes. In some embodiments, magnetization of fixed magnetic layer 403b is orthogonal to magnetization of fixed magnetic layer 403a. In some embodiments, when non-magnetic metal layer 402b is sandwiched between 4-state free magnetic layer 401b and fixed magnetic layer 403b, then the second magnetic junction is a spin valve. In some embodiments, when dielectric layer 402b is sandwiched between 4-state free magnetic layer 401b and fixed magnetic layer 403b, then the second magnetic junction is a magnetic tunneling junction. In some embodiments, fixed magnetic layer 403b is formed of the same material as fixed magnetic layer 403a.

In some embodiments, layer 404b is adjacent to fixed magnetic layer 403b. In some embodiments, layer 404b comprises Ru. In some embodiments, layer 405b is adjacent to layer 404b. In some embodiment, layer 405b comprises Co and Fe (e.g., CoFe). In some embodiments, layer 406b is adjacent to layer 405b. In some embodiments, layer 406b comprises Ir and Mn (e.g., IrMn). In some embodiments, layer 407b is adjacent to layer 406b. In some embodiments, layer 407b comprises Ru. In some embodiments, layer 408b is adjacent to layer 407b. In some embodiments, layer 408b comprises Ta. In some embodiments, layer 409b is adjacent to layer 408b. In some embodiments, layer 409b comprises Ru. In some embodiments, an electrode (not shown and similar to layer 107) is adjacent to layer 409b.

In some embodiments, free 4-state magnet 401a of the first magnetic junction is adjacent to SOC material 422a/b. For example, free 4-state magnet 401a directly couples with SOC material 422a/b. In some embodiments, SOC material 422a/b is a single layer fabricated to have crisscross shape. In this example, SOC material 422a represents SOC material along the x-direction while SOC material 422b represents SOC material along the y-direction. In some embodiments, free 4-state magnet 401b of the second magnetic junction is also adjacent to SOC material 422a/b. In some embodiments, SOC material 422a/b is made of one or more materials comprising β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. In some embodiments, SOC material is formed of 2D material or thin 3D material with high spin orbit effect that generates perpendicular spin currents. Examples of 2D material include: Graphene, $MoS_2$, $WSe_2$, $WS_2$, and $MoSe_2$. In some embodiments, the spin orbit material 422a/b is selected from a group consisting of: graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, and $SrFBiS_2$.

In some embodiments, quaternary spin Hall device 400 comprises interconnects 423a/b/c/d for writing to first and second magnetic junctions. In some embodiments, quaternary spin Hall device 400 comprises first interconnect 423a coupled to layer of spin orbit coupling material 422a. In this example, first interconnect 423a extends along the x-direction. In some embodiments, quaternary spin Hall device 400 comprises second interconnect 423b coupled to a layer of spin orbit coupling material 422a. In this example, second interconnect 423b also extends along the x-direction. In some embodiments, quaternary spin Hall device 400 comprises third interconnect 423c coupled to layer of spin orbit coupling material 422b. In this example, third interconnect 423c extends along the y-direction (e.g., third interconnect 423c is orthogonal to second interconnect 423b). In some embodiments, quaternary spin Hall device 400 comprises fourth interconnect 423d coupled to layer of spin orbit coupling material 422b. In this example, fourth interconnect 423d extends along the y-direction (e.g., fourth interconnect 423d is orthogonal to second interconnect 423b). In some embodiments, first, second, third, and fourth interconnects 423a/b/c/d are made of the same material as interconnects 123a/b.

In some embodiments, to write to the first magnetic junction, first write current $I_{w1}$ is provided to interconnect 423c which when flows through SOC layer 422b and another interconnect 423d, first write current $I_{w1}$ generates a spin current polarized in the plane of quaternary spin Hall device 400 and propagating perpendicular to the plane of quaternary spin Hall device 400 and along the first magnetic junction. In some embodiments, the direction of first write current $I_{w1}$ (e.g., along +y-direction or -y-direction) programs the magnetization of 4-state free magnet 401a either in states '0' or state '3'. In some embodiments, the programmed magnetization of 4-state free magnet 401a is read via TMR by applying $I_{read}$ along the vertical stack of first magnetic junction and sensing whether the magnetization of 4-state free magnet 401a is parallel or antiparallel to magnetization 411 of fixed magnetic layer 403a.

In some embodiments, to write to the second magnetic junction, second write current $I_{w2}$ is provided to interconnect 423a which when flows through SOC layer 422a and another interconnect 423b, second write current $I_{w2}$ generates a spin current polarized in the plane of quaternary spin Hall device 400 and propagating perpendicular to the plane of quaternary spin Hall device 400, but towards second magnetic junction. In some embodiments, the direction of second write current $I_{w2}$ (e.g., along x-direction or -x-direction) programs the magnetization of 4-state free magnet 401b either in states '1' or state '2'. In some embodiments, the programmed magnetization of 4-state free magnet 401b is read via TMR by applying $I_{read}$ along the vertical stack of second magnetic junction and sensing whether the magnetization of 4-state free magnet 403b is parallel or antiparallel to magnetization 412 of fixed magnetic layer 403b.

FIG. 4B illustrates top view 420 of the quaternary spin Hall device 400 of FIG. 4A along cross-section AA showing write paths for +x, -x, +y, and -y directions, according to some embodiments of the disclosure.

FIG. 5A illustrates a 3D view of a 4-state spin Hall memory 500 with a single recording layer and single fixed layer, in accordance with some embodiments of the disclosure. It is pointed out that those elements of FIG. 5A having the same reference numbers (or names) as the elements of any other figure can operate or function in any manner similar to that described, but are not limited to such.

Compared to 4-state spin Hall memory 400, 4-state spin Hall memory 500 uses a single fixed magnetic layer which is configured for multiple differential readouts. In some embodiments, 4-state spin Hall memory 500 exhibits four distinct resistance states. In some embodiments, two sets of differential sensing is used to increase the read out speed. Here, spin orbit coupling material can exhibit bulk spin Hall effect or interface Rashba-Edelstein effect.

In some embodiments, fixed magnetic layer 403a is replaced with fixed magnetic layer 503a having magnetization 511 pointing at an angle (e.g., between 0 degrees and 90 degrees). In some embodiments, magnetization 511 points along a direction which is not equal to 45 degrees with the y-axis.

The impedance or resistance of the stack of 4-state spin Hall memory 500 can be expressed as conductance G:

$$G = G_p \cos^2\frac{\theta}{2} + G_{ap}\sin^2\frac{\theta}{2} = \frac{G_p + G_{ap}}{2} + \frac{G_p - G_{ap}}{2}\cos\theta$$

where $G_{ap}$ is antiparallel conductance of the stack of 4-state spin Hall memory 500, where $G_p$ is the parallel conductance of the stack of 4-state spin Hall memory 500, and θ is the angle between the free and fixed layer magnetization directions. If the angle between the +x axis and the fixed layer magnetization is set to be β=18.43°, then sin/β=0.32175 and cos θ for states '0', '1', '2', and '3' has the values of 3 sin β, sin β, −sin β, −3 sin β, respectively. This results in four different values of conductance.

In some embodiments, to write either states '0' or '3' to the magnetic junction, first write current $I_{w1}$ is provided to interconnect 423c which when flows through SOC layer 422b and another interconnect 423d, first write current $I_{w1}$ generates a spin current polarized in the plane of quaternary spin Hall device 500 and propagating perpendicular to the place of quaternary spin Hall device 500 and along the magnetic junction. In some embodiments, the direction of first write current $I_{w1}$ (e.g., along +y-direction or −y-direction) programs the magnetization of 4-state free magnet 401a of quaternary spin Hall device 500 to either states '0' or state '3'. In some embodiments, the programmed magnetization of 4-state free magnet 401a is read via TMR by applying $I_{read}$ along the vertical stack of magnetic junction and sensing resistance of the stack of layers.

In some embodiments, to write either states '1' or '2' to the magnetic junction, second write current $I_{w2}$ is provided to interconnect 423a which, when flows through SOC layer 422a and another interconnect 423b, generates a spin current polarized in the plane of quaternary spin Hall device 500 and propagating perpendicular to the place of quaternary spin Hall device 500, but towards the magnetic junction. In some embodiments, the direction of second write current $I_{w2}$ (e.g., along x-direction or −x-direction) programs the magnetization of 4-state free magnet 403b either in states '1' or state '2'. In some embodiments, the programmed magnetization of 4-state free magnet 401a is read via TMR by applying $I_{read}$ along the vertical stack of second magnetic junction and sensing.

FIG. 5B illustrates top view 520 of the 4-state spin Hall memory 500 of FIG. 5A along cross-section AA showing write paths for +x, −x, +y, and −y directions, according to some embodiments of the disclosure.

FIG. 6A illustrates a 3D view of a 4-state spin Hall memory 600 with a single recording layer and single fixed layer, and with an inverse SOC based readout, in accordance with some embodiments of the disclosure. It is pointed out that those elements of FIG. 6A having the same reference numbers (or names) as the elements of any other figure can operate or function in any manner similar to that described, but are not limited to such.

Here spin orbit coupling material 622a/b can exhibit bulk spin Hall effect and it can exhibit interface Rashba Edelstein effect that allows for inverse SOC readout. In some embodiments, a differential Rashba read-out is used where spin-to-charge conversion is performed by the bottom electrode 622b. Compared to FIG. 5A, here TMR is not used for readout. As such, in some embodiments, fixed magnet layer can be removed and is not shown in FIG. 6A. However, fixed magnet layer can be still used without changing the essence of the embodiments.

In some embodiments, applying voltage between electrodes 409a and 423b and 423d creates current $I_{read}$. The inverse SOC effect causes generation of charge currents $I_{r1}$ proportional to Iread*sin θ in interconnect 423a to 423b, and causes generation of charge currents $I_{r21}$ proportional to Iread*cos θ in interconnect 423c to 423d. Here θ is the angle between the free layer magnetization and the +x axis. Detecting both currents and obtaining their sum and difference (e.g., differential detection) permits unambiguous determination of the angle of magnetization, in accordance with some embodiments.

FIG. 6B illustrates a top view 620 of the 4-state spin Hall memory 600 of FIG. 6A, in accordance with some embodiments of the disclosure.

Various embodiments can be realized on a chip or die. One example of a chip is described with reference to FIG. 7. However, the embodiments are not limited to a SoC (System-on-Chip) but can be implemented in any die or chip. In some embodiments, various embodiments are coupled to a chip or die.

Figure 7:
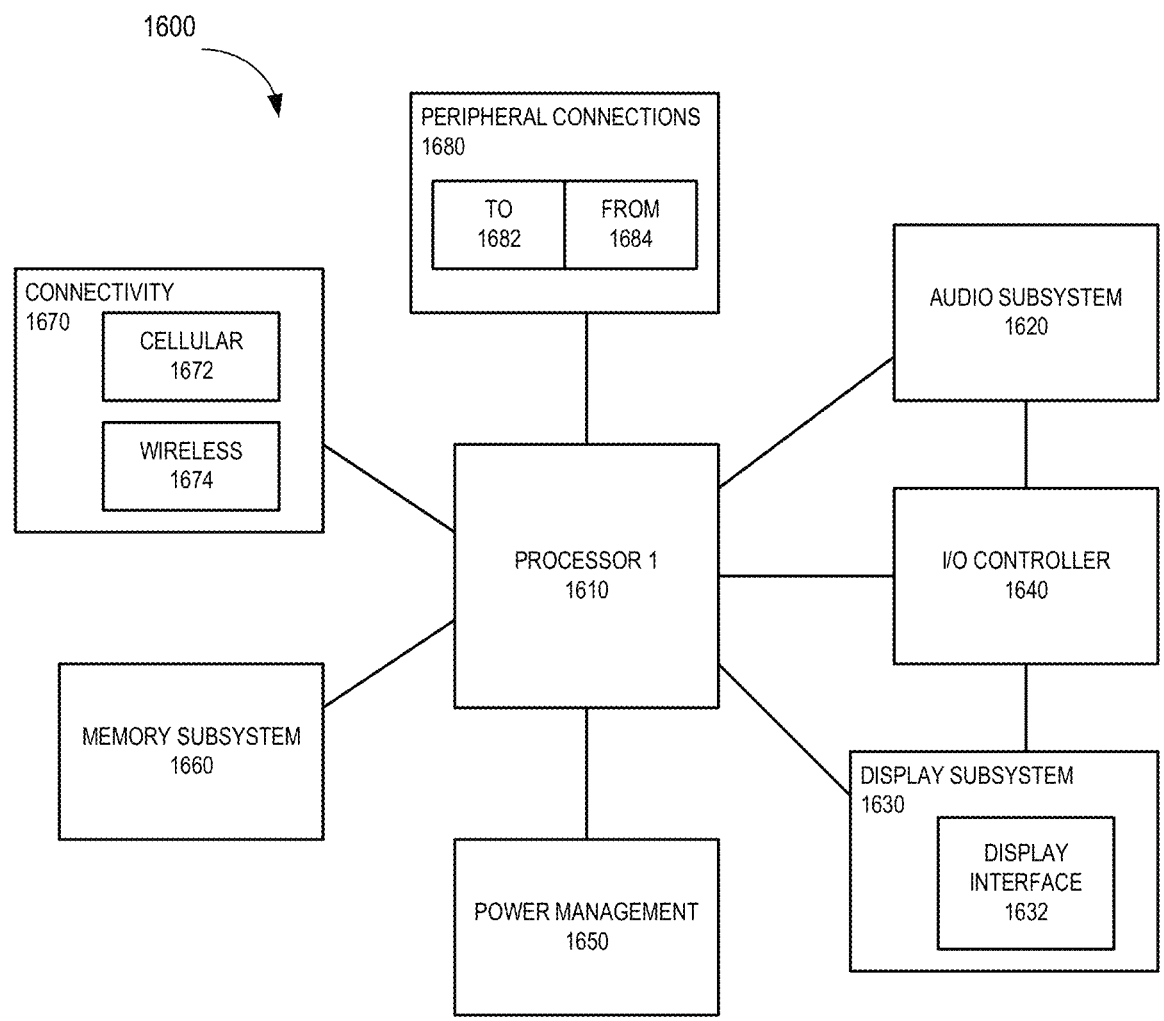
FIG. 7 illustrates a smart device or a computer system or a SoC (System-on-Chip) with 4-state spin Hall memory, according to some embodiments.

FIG. 7 illustrates a smart device or a computer system or a SoC with 4-state spin Hall memory, according to some embodiments. It is pointed out that those elements of FIG. 7 having the same reference numbers (or names) as the elements of any other figure can operate or function in any manner similar to that described, but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 7 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 and network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. In some embodiments, processor 1610 includes 4-state spin Hall memory of various embodiments. In other embodiments, any other block of computing device may include 4-state spin Hall memory. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600. In some embodiments, Memory subsystem 1660 includes the scheme of analog in-memory pattern matching with the use of resistive memory elements. In some embodiments, memory subsystem includes a 4-state spin Hall memory, according to some embodiments Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. Various embodiments here can be can be combined with any of the other embodiments thereby allowing various combinations.

For example, an apparatus is provided which comprises: a first magnetic junction having a fixed magnetic layer and a 4-state free magnetic layer; a second magnetic junction having a fixed magnetic layer and a 4-state free magnetic layer; and a first layer of spin orbit coupling material adjacent to the first magnetic junction and the second magnetic junction via their respective 4-state free magnetic layers. In some embodiments, the apparatus a second layer of spin orbit coupling material adjacent to the first layer of spin orbit coupling material, wherein the first layer is orthogonal to the second layer. In some embodiments, the apparatus comprises: a first interconnect coupled to the first layer of spin orbit coupling material; and a second interconnect orthogonal to the first interconnect, wherein the second interconnect is coupled to the second layer of spin orbit coupling material.

In some embodiments, the spin orbit material for the first and second layers is selected from a group consisting of: graphene $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, and $SrFBiS_2$. In some embodiments, the first magnetic junction is one of a spin valve or a magnetic tunneling junction (MTJ). In some embodiments, the second magnetic junction is one of a spin valve or a magnetic tunneling junction (MTJ). In some embodiments, the fixed magnet layer of the first and second magnetic junctions comprises one or a combination of materials selected from a group consisting of a Heusler alloy, Co, Fe, Ni, Gd, B, Ge, Ga, permalloy, and Yttrium Iron Garnet (YIG), and wherein the Heusler alloy is a material selected from a group consisting of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, and MnGaRu.

In some embodiments, the 4-state free magnetic layer of the first and second magnetic junctions include four stable magnetic states including zero state, first state, second state, and third state, wherein the zero state is to point in a +x-direction, wherein the first state is to point in a +y-direction, wherein the second state is to point in a −y-direction, and wherein the third state is to point in a −x-direction, and wherein a thermal barrier between the zero, first, second, and third, is equal or greater than 10 kT. In some embodiments, the 4-state free magnetic layer of the first and second magnetic junctions comprises a material selected from a group consisting of: Fe, Ni, Co and their alloys, magnetic insulators, and Heusler alloys of the form $X_2YZ$, and wherein the magnetic insulators comprises a material selected from a group consisting of: magnetite, $Fe_3O_4$, and $Y_3Al_5O_{12}$. In some embodiments, the 4-state free magnetic layer of the first and second magnetic junctions comprises a material of bi-axial anisotropy.

In some embodiments, the apparatus comprises: a first layer comprising Ru adjacent to the fixed magnetic layer of the first magnetic junction; a dielectric layer or a metal layer adjacent to the fixed magnetic layer and the 4-state free magnetic layer of the first magnetic junction; a second layer comprising Co and Fe, wherein the second layer is adjacent to the first layer; a third layer comprising Ir and Mn, wherein the third layer is adjacent to the second layer; a fourth layer comprising Ru, wherein the fourth layer is adjacent to the third layer; a fifth layer comprising Ta, wherein the fifth layer is adjacent to the fourth layer; and a sixth layer comprising Ru, wherein the fourth layer is adjacent to the third layer. In some embodiments, the apparatus comprises: a first layer comprising Ru adjacent to the fixed magnetic layer of the second magnetic junction; a dielectric layer or a metal layer adjacent to the fixed magnetic layer and the 4-state free magnetic layer of the second magnetic junction; a second layer comprising Co and Fe, wherein the second layer is adjacent to the first layer; a third layer comprising Ir and Mn, wherein the third layer is adjacent to the second layer; a fourth layer comprising Ru, wherein the fourth layer is adjacent to the third layer; a fifth layer comprising Ta, wherein the fifth layer is adjacent to the fourth layer; and a sixth layer comprising Ru, wherein the fourth layer is adjacent to the third layer.

In another example, a system is provided which comprises: a memory; a processor coupled to the memory, the processor having an apparatus according to the apparatus described above; and a wireless interface for allowing the processor to communicate with another device.

In another example, an apparatus is provided which comprises: a 4-state free magnetic layer; a layer of spin orbit coupling material adjacent to the 4-state free magnetic layer; and a first interconnect coupled to the layer of spin orbit coupling material. In some embodiments, the apparatus comprises a second interconnect orthogonal to the first interconnect, wherein the second interconnect is coupled to the layer of spin orbit coupling material. In some embodiments, the apparatus comprises a fixed magnetic layer that has a magnetization at an angle between 0 degrees and 90 degrees, wherein the fixed magnetic layer is coupled to the 4-state free magnetic layer via a metal layer or a dielectric layer. In some embodiments, the apparatus comprises a dielectric layer adjacent to the 4-state free magnetic layer. In some embodiments, the apparatus comprises: a first layer comprising Ru adjacent to the dielectric layer; a second layer comprising Co and Fe, wherein the second layer is adjacent to the first layer; a third layer comprising Ir and Mn, wherein the third layer is adjacent to the second layer; a fourth layer comprising Ru, wherein the fourth layer is adjacent to the third layer; a fifth layer comprising Ta, wherein the fifth layer is adjacent to the fourth layer; and a sixth layer comprising Ru, wherein the fourth layer is adjacent to the third layer.

In some embodiments, the spin orbit coupling material comprises a material selected from a group consisting of: Cu, Ag, Al, and 2D conducting materials, and wherein the 2D conducting materials include graphene. In some embodiments, the 4-state free magnetic layer includes four stable magnetic states including zero state, first state, second state, and third state, wherein the zero state is to point in a +x-direction, wherein the first state is to point in a +y-direction, wherein the second state is to point in a −y-direction, and wherein the third state is to point in a −x-direction. In some embodiments, the spin orbit material is selected from a group consisting of: graphene $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, and $SrFBiS_2$. In some embodiments, the magnetic junction is one of a spin valve or a magnetic tunneling junction (MTJ).

In some embodiments, the fixed magnet layer comprises one or a combination of materials selected from a group consisting of a Heusler alloy, Co, Fe, Ni, Gd, B, Ge, Ga, permalloy, and Yttrium Iron Garnet (YIG), wherein the Heusler alloy is a material selected from a group consisting of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, and MnGaRu. In some embodiments, the 4-state free magnetic layer of the first and second magnetic junctions comprises a material selected from a group consisting of: Fe, Ni, Co and their alloys, magnetic insulators, and Heusler alloys of the form $X_2YZ$, and wherein the magnetic insulators comprises a material selected from a group consisting of: magnetite, $Fe_3O_4$, and $Y_3Al_5O_{12}$. In some embodiments, the 4-state free magnetic layer comprises a material of bi-axial anisotropy.

In another example, a system is provided which comprises: a memory; a processor coupled to the memory, the processor having an apparatus according to the apparatus described above; and a wireless interface for allowing the processor to communicate with another device.

In another example, a method is provided which comprises: forming a first magnetic junction having a fixed magnetic layer and a 4-state free magnetic layer; forming a second magnetic junction having a fixed magnetic layer and a 4-state free magnetic layer; and forming a first layer of spin orbit coupling material such that it is adjacent to the first and second magnetic junctions via their respective 4-state free magnetic layers. In some embodiments, the method comprises forming a second layer of spin orbit coupling material adjacent to the first layer of spin orbit coupling material, wherein the first layer is orthogonal to the second layer. In some embodiments, the apparatus comprises: forming a first interconnect coupled to the first layer of spin orbit coupling material; and forming a second interconnect orthogonal to the first interconnect, wherein the second interconnect is coupled to the second layer of spin orbit coupling material.

In some embodiments, the spin orbit material for the first and second layers is selected from a group consisting of: graphene $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, and $SrFBiS_2$. In some embodiments, the first magnetic junction is one of a spin valve or a magnetic tunneling junction (MTJ). In some embodiments, the second magnetic junction is one of a spin valve or a magnetic tunneling junction (MTJ). In some embodiments, the fixed magnet layer of the first and second magnetic junctions comprises one or a combination of materials selected from a group consisting of a Heusler alloy, Co, Fe, Ni, Gd, B, Ge, Ga, permalloy, and Yttrium Iron Garnet (YIG), and wherein the Heusler alloy is a material selected from a group consisting of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, and MnGaRu.

In some embodiments, the 4-state free magnetic layer of the first and second magnetic junctions include four stable magnetic states including zero state, first state, second state, and third state, wherein the zero state is to point in a +x-direction, wherein the first state is to point in a +y-direction, wherein the second state is to point in a −y-direction, and wherein the third state is to point in a −x-direction, and wherein a thermal barrier between the zero, first, second, and third, is equal or greater than 10 kT. In some embodiments, the 4-state free magnetic layer of the first and second magnetic junctions comprises a material selected from a group consisting of: Fe, Ni, Co and their alloys, magnetic insulators, and Heusler alloys of the form $X_2YZ$, and wherein the magnetic insulators comprises a material selected from a group consisting of: magnetite, $Fe_3O_4$, and $Y_3Al_5O_{12}$.

In some embodiments, the 4-state free magnetic layer of the first and second magnetic junctions comprises a material of bi-axial anisotropy. In some embodiments, the method comprises: forming a first layer comprising Ru adjacent to the fixed magnetic layer of the first magnetic junction; forming a dielectric layer or a metal layer adjacent to the fixed magnetic layer and the 4-state free magnetic layer of the first magnetic junction; forming a second layer comprising Co and Fe, wherein the second layer is adjacent to the first layer; forming a third layer comprising Ir and Mn, wherein the third layer is adjacent to the second layer; forming a fourth layer comprising Ru, wherein the fourth layer is adjacent to the third layer; forming a fifth layer comprising Ta, wherein the fifth layer is adjacent to the fourth layer; and forming a sixth layer comprising Ru, wherein the fourth layer is adjacent to the third layer.

In some embodiments, the method comprises: forming a first layer comprising Ru adjacent to the fixed magnetic layer of the second magnetic junction; forming a dielectric layer or a metal layer adjacent to the fixed magnetic layer and the 4-state free magnetic layer of the second magnetic junction; forming a second layer comprising Co and Fe, wherein the second layer is adjacent to the first layer; forming a third layer comprising Ir and Mn, wherein the third layer is adjacent to the second layer; forming a fourth layer comprising Ru, wherein the fourth layer is adjacent to the third layer; forming a fifth layer comprising Ta, wherein the fifth layer is adjacent to the fourth layer; and forming a sixth layer comprising Ru, wherein the fourth layer is adjacent to the third layer.

In another example, a method is provided which comprises: forming a 4-state free magnetic layer; forming a layer of spin orbit coupling material adjacent to the 4-state free magnetic layer; and forming a first interconnect coupled to the layer of spin orbit coupling material. In some embodiments, the method comprises forming a second interconnect orthogonal to the first interconnect, wherein the second interconnect is coupled to the layer of spin orbit coupling material. In some embodiments, the method comprises: forming a fixed magnetic layer that has a magnetization at an angle between 0 degrees and 90 degrees, wherein the fixed magnetic layer is coupled to the 4-state free magnetic layer via a metal layer or a dielectric layer. In some embodiments, the method comprises forming a dielectric layer adjacent to the 4-state free magnetic layer.

In some embodiments, the method comprises: forming a first layer comprising Ru adjacent to the dielectric layer; forming a second layer comprising Co and Fe, wherein the second layer is adjacent to the first layer; forming a third layer comprising Ir and Mn, wherein the third layer is adjacent to the second layer; forming a fourth layer comprising Ru, wherein the fourth layer is adjacent to the third layer; forming a fifth layer comprising Ta, wherein the fifth layer is adjacent to the fourth layer; and forming a sixth layer comprising Ru, wherein the fourth layer is adjacent to the third layer. In some embodiments, the spin orbit coupling material comprises a material selected from a group consisting of: Cu, Ag, Al, and 2D conducting materials, and wherein the 2D conducting materials include graphene.

In some embodiments, the 4-state free magnetic layer includes four stable magnetic states including zero state, first state, second state, and third state, wherein the zero state is to point in a +x-direction, wherein the first state is to point in a +y-direction, wherein the second state is to point in a −y-direction, and wherein the third state is to point in a −x-direction. In some embodiments, the spin orbit material is selected from a group consisting of: graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, and $SrFBiS_2$. In some embodiments, the magnetic junction is one of a spin valve or a magnetic tunneling junction (MTJ). In some embodiments, the fixed magnet layer comprises one or a combination of materials selected from a group consisting of a Heusler alloy, Co, Fe, Ni, Gd, B, Ge, Ga, permalloy, and Yttrium Iron Garnet (YIG), wherein the Heusler alloy is a material selected from a group consisting of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, and MnGaRu. In some embodiments, the 4-state free magnetic layer of the first and second magnetic junctions comprises a material selected from a group consisting of: Fe, Ni, Co and their alloys, magnetic insulators, and Heusler alloys of the form $X_2YZ$, and wherein the magnetic insulators comprises a material selected from a group consisting of: magnetite, $Fe_3O_4$, and $Y_3Al_5O_{12}$. In some embodiments, the 4-state free magnetic layer comprises a material of bi-axial anisotropy.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
   a first magnetic junction having a fixed magnetic layer and a 4-state free magnetic layer;
   a second magnetic junction having a fixed magnetic layer and a 4-state free magnetic layer;
   a first layer of spin orbit material adjacent to the first magnetic junction and the second magnetic junction via their respective 4-state free magnetic layers; and
   a second layer of spin orbit material adjacent to the first layer of spin orbit material, and wherein the first layer is orthogonal to the second layer.
2. The apparatus of claim 1 comprises:
   a first interconnect coupled to the first layer of spin orbit material; and
   a second interconnect orthogonal to the first interconnect, wherein the second interconnect is coupled to the second layer of spin orbit material.
3. The apparatus of claim 1, wherein the spin orbit material for the first and second layers includes one or more of: graphene, Ti, S, W, Mo, Se, B, Sb, Ta, Re, La, C, P, As, Sc, Bi, Ga, Al, Y, In, Ce, Pr, Nd, Se, or F.
4. The apparatus of claim 1, wherein the first magnetic junction is one of a spin valve or a magnetic tunneling junction (MTJ).
5. The apparatus of claim 1, wherein the second magnetic junction is one of a spin valve or a magnetic tunneling junction (MTJ).
6. The apparatus of claim 1, wherein the fixed magnetic layer of the first and second magnetic junctions includes one or more of: Heusler alloy, Co, Fe, Ni, Gd, B, Ge, Ga, permalloy, or Yttrium Iron Garnet (YIG), and wherein the Heusler alloy includes one or more of: Cu, Mn, Al, In, Sn, Ni, Sn, Sb, Ga, Co, Ge, Pd, Fe, Si, V, or Ru.
7. The apparatus of claim 1, wherein the 4-state free magnetic layer of the first and second magnetic junctions include four stable magnetic states including: zero state, first state, second state, and third state, wherein the zero state is to point in a +x-direction, wherein the first state is to point in a +y-direction, wherein the second state is to point in a y-direction, and wherein the third state is to point in a x-direction, and wherein a thermal barrier between the zero, first, second, and third, is equal or greater than 10 kT.

8. The apparatus of claim 1, wherein the 4-state free magnetic layer of the first and second magnetic junctions includes one or more of: Fe, Ni, Co and their alloys, magnetic insulators, or Heusler alloys of the form $X_2YZ$, and wherein the magnetic insulators comprises a material which includes one or more of: magnetite, Fe, Y, or Al.

9. The apparatus of claim 1, wherein the 4-state free magnetic layer of the first and second magnetic junctions comprises a material of bi-axial anisotropy.

10. The apparatus of claim 1 comprises:
a first layer comprising Ru adjacent to the fixed magnetic layer of the first magnetic junction;
a dielectric layer or a metal layer adjacent to the fixed magnetic layer and the 4-state free magnetic layer of the first magnetic junction;
a second layer comprising Co and Fe, wherein the second layer is adjacent to the first layer;
a third layer comprising Ir and Mn, wherein the third layer is adjacent to the second layer;
a fourth layer comprising Ru, wherein the fourth layer is adjacent to the third layer;
a fifth layer comprising Ta, wherein the fifth layer is adjacent to the fourth layer; and
a sixth layer comprising Ru, wherein the fourth layer is adjacent to the third layer.

11. The apparatus of claim 1 comprises:
a first layer comprising Ru adjacent to the fixed magnetic layer of the second magnetic junction;
a dielectric layer or a metal layer adjacent to the fixed magnetic layer and the 4-state free magnetic layer of the second magnetic junction;
a second layer comprising Co and Fe, wherein the second layer is adjacent to the first layer;
a third layer comprising Ir and Mn, wherein the third layer is adjacent to the second layer;
a fourth layer comprising Ru, wherein the fourth layer is adjacent to the third layer;
a fifth layer comprising Ta, wherein the fifth layer is adjacent to the fourth layer; and
a sixth layer comprising Ru, wherein the fourth layer is adjacent to the third layer.

12. An apparatus comprising:
a 4-state free magnetic layer;
a first layer of spin orbit material adjacent to the 4-state free magnetic layer;
an interconnect coupled to the first layer of spin orbit material; and
a second layer of spin orbit material adjacent to the first layer of spin orbit material, and wherein the first layer is orthogonal to the second layer.

13. The apparatus of claim 12, wherein the interconnect is a first interconnect, wherein the apparatus comprises:
a second interconnect orthogonal to the first interconnect, wherein the second interconnect is coupled to the first layer of spin orbit material; and
a fixed magnetic layer that has a magnetization at an angle between 0 degrees and 90 degrees, wherein the fixed magnetic layer is coupled to the 4-state free magnetic layer via a metal layer or a dielectric layer.

14. The apparatus of claim 12 comprises a dielectric layer adjacent to the 4-state free magnetic layer.

15. The apparatus of claim 14 comprises:
a first layer comprising Ru adjacent to the dielectric layer;
a second layer comprising Co and Fe, wherein the second layer is adjacent to the first layer;
a third layer comprising Ir and Mn, wherein the third layer is adjacent to the second layer;
a fourth layer comprising Ru, wherein the fourth layer is adjacent to the third layer;
a fifth layer comprising Ta, wherein the fifth layer is adjacent to the fourth layer; and
a sixth layer comprising Ru, wherein the fourth layer is adjacent to the third layer.

16. The apparatus of claim 12, wherein the spin orbit material comprises a material which includes one or more of: Cu, Ag, Al, or 2D conducting materials, and wherein the 2D conducting materials include graphene.

17. The apparatus of claim 12, wherein the 4-state free magnetic layer includes four stable magnetic states including zero state, first state, second state, and third state, wherein the zero state is to point in a +x-direction, wherein the first state is to point in a +y-direction, wherein the second state is to point in a −y-direction, and wherein the third state is to point in a −x-direction.

18. The apparatus of claim 12, wherein the spin orbit material for the first and second layers includes one or more of: graphene, Ti, S, W, Mo, Se, B, Sb, Ta, Re, La, C, P, As, Sc, Bi, Ga, Al, Y, In, Ce, Pr, Nd, Se, or F.

19. The apparatus of claim 12, wherein the magnetic junction is one of a spin valve or a magnetic tunneling junction (MTJ).

20. The apparatus of claim 12, wherein the fixed magnet layer includes one or more of: Heusler alloy, Co, Fe, Ni, Gd, B, Ge, Ga, permalloy, or Yttrium Iron Garnet (YIG), and wherein the Heusler alloy includes one or more of: Cu, Mn, Al, In, Sn, Ni, Sn, Sb, Ga, Co, Ge, Pd, Fe, Si, V, or Ru.

21. The apparatus of claim 12, wherein the 4-state free magnetic layer of the first and second magnetic junctions includes one or more of: Fe, Ni, Co and their alloys, magnetic insulators, or Heusler alloys of the form $X_2YZ$, and wherein the magnetic insulators comprises a material which includes one or more of: magnetite, Fe, Y, or Al.

22. The apparatus of claim 12, wherein the 4-state free magnetic layer comprises a material of bi-axial anisotropy.

23. A system comprising:
a memory;
a processor coupled to the memory, the processor having a an apparatus which comprises:
a first magnetic junction having a fixed magnetic layer and a 4-state free magnetic layer, wherein the fixed magnetic layer and the 4-state free magnetic layer of the first magnetic junction have in-plane magnetizations;
a second magnetic junction having a fixed magnetic layer and a 4-state free magnetic layer, wherein the fixed magnetic layer and the 4-state free magnetic layer of the second magnetic junction have in-plane magnetizations;
a first layer of spin orbit material adjacent to the first magnetic junction and the second magnetic junction via their respective 4-state free magnetic layers;
a second layer of spin orbit material adjacent to the first layer of spin orbit material, wherein the first layer is orthogonal to the second layer;
a first interconnect coupled to the first layer of spin orbit material; and
a second interconnect orthogonal to the first interconnect, wherein the second interconnect is coupled to the second layer of spin orbit material; and a wireless interface to allow the processor to communicate with another device.

\* \* \* \* \*